United States Patent
Zeyen et al.

(10) Patent No.: US 9,156,679 B1
(45) Date of Patent: Oct. 13, 2015

(54) METHOD AND DEVICE USING SILICON SUBSTRATE TO GLASS SUBSTRATE ANODIC BONDING

(71) Applicant: Innovative Micro Technology, Goleta, CA (US)

(72) Inventors: Benedikt Zeyen, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 14/326,406

(22) Filed: Jul. 8, 2014

(51) Int. Cl.
| | | |
|---|---|---|
| H01L 31/00 | (2006.01) | |
| H01L 21/00 | (2006.01) | |
| B81B 7/00 | (2006.01) | |
| B81C 1/00 | (2006.01) | |
| H01L 23/04 | (2006.01) | |
| H01L 31/0203 | (2014.01) | |
| H01L 33/48 | (2010.01) | |
| H01L 31/18 | (2006.01) | |

(52) U.S. Cl.
CPC ........... *B81B 7/0067* (2013.01); *B81C 1/00317* (2013.01); *H01L 23/04* (2013.01); *H01L 31/0203* (2013.01); *H01L 31/18* (2013.01); *H01L 33/483* (2013.01); *B81B 2201/047* (2013.01); *B81B 2207/093* (2013.01); *B81C 2203/019* (2013.01); *B81C 2203/0118* (2013.01); *B81C 2203/031* (2013.01); *H01L 2933/0033* (2013.01)

(58) Field of Classification Search
CPC ......... H01L 24/05; H01L 24/07; H01L 24/80; H01L 2924/10253; H01L 2924/1461; H01L 2924/15; H01L 2224/48242; H01L 2224/48249; H01L 224/48505; H01L 2224/48091; B81B 7/0067; B81B 2201/047; B81B 2207/093; B81C 1/00317; B81C 2203/019; B81C 2203/0118; B81C 2203/031
See application file for complete search history.

(56) References Cited

U.S. PATENT DOCUMENTS

| | | | | |
|---|---|---|---|---|
| 6,852,420 | B2 * | 2/2005 | Yamamoto et al. | 428/446 |
| 7,569,926 | B2 * | 8/2009 | Carlson et al. | 257/704 |
| 2002/0109069 | A1 * | 8/2002 | Yamamoto et al. | 249/134 |
| 2007/0048898 | A1 * | 3/2007 | Carlson et al. | 438/106 |

* cited by examiner

*Primary Examiner* — Nikolay Yushin
(74) *Attorney, Agent, or Firm* — Jaquelin Spong

(57) ABSTRACT

A bonding technology is disclosed that can form an anodic, conductive bond between two optically transparent substrates. The anodic bond may be accompanied by a Second bond, for example a metal alloy, solder, eutectic and polymer bond. The two bonds may be used for the same or a different purpose, and may be selected for the following attributes: hermeticity, electrical conductivity, low RF loss, high adhesive strength, leak resistance, thermal conductivity. The attributes for each bonding technology may be the same, or they may be different.

23 Claims, 12 Drawing Sheets

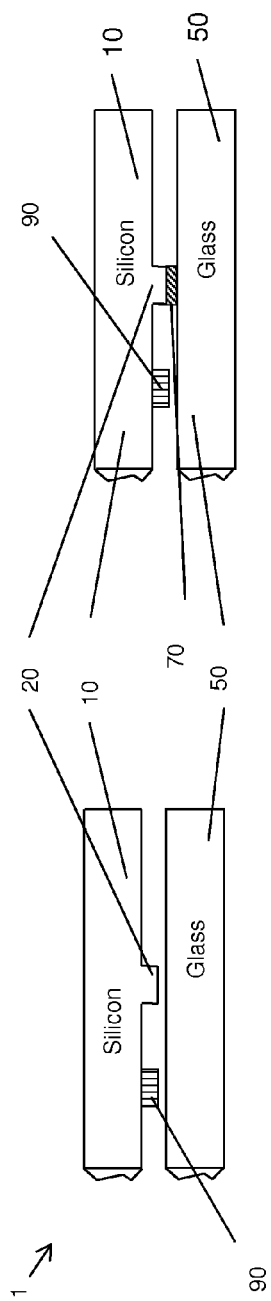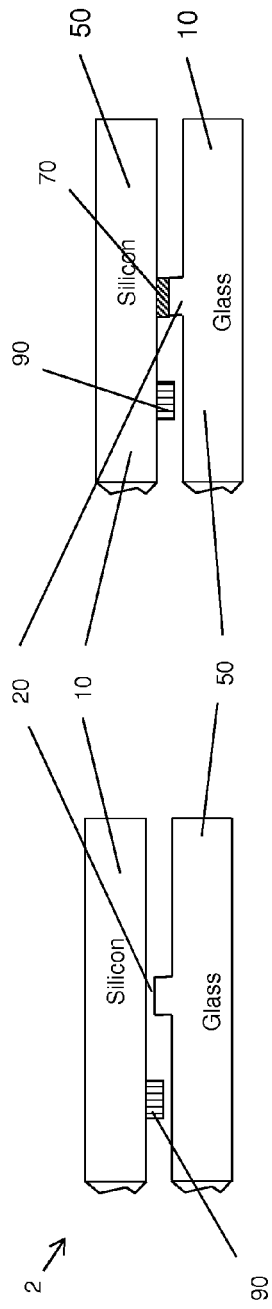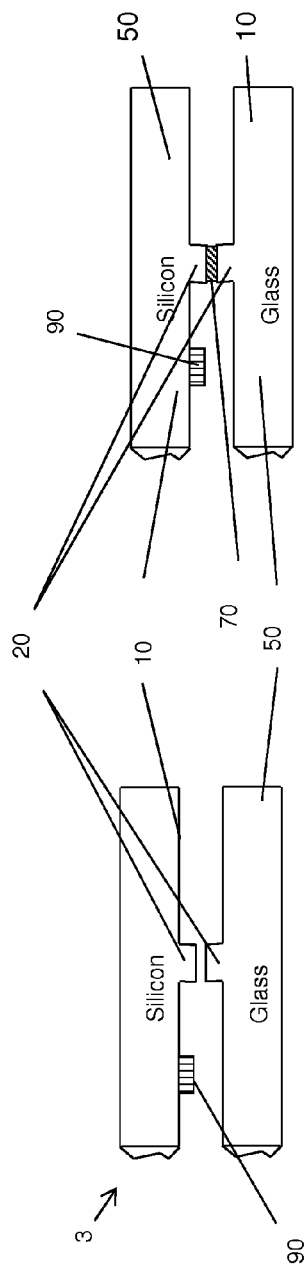
Fig. 1a
Fig. 1b
Fig. 1c

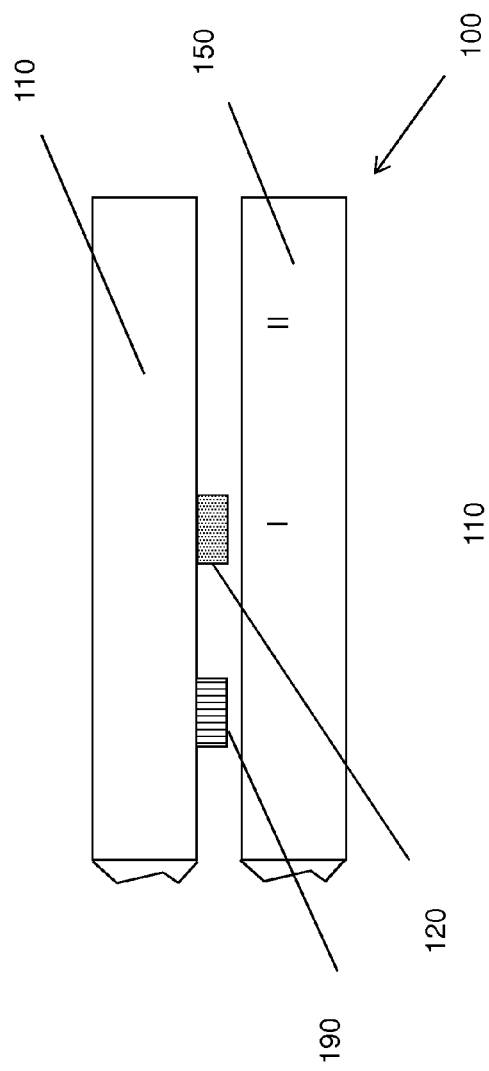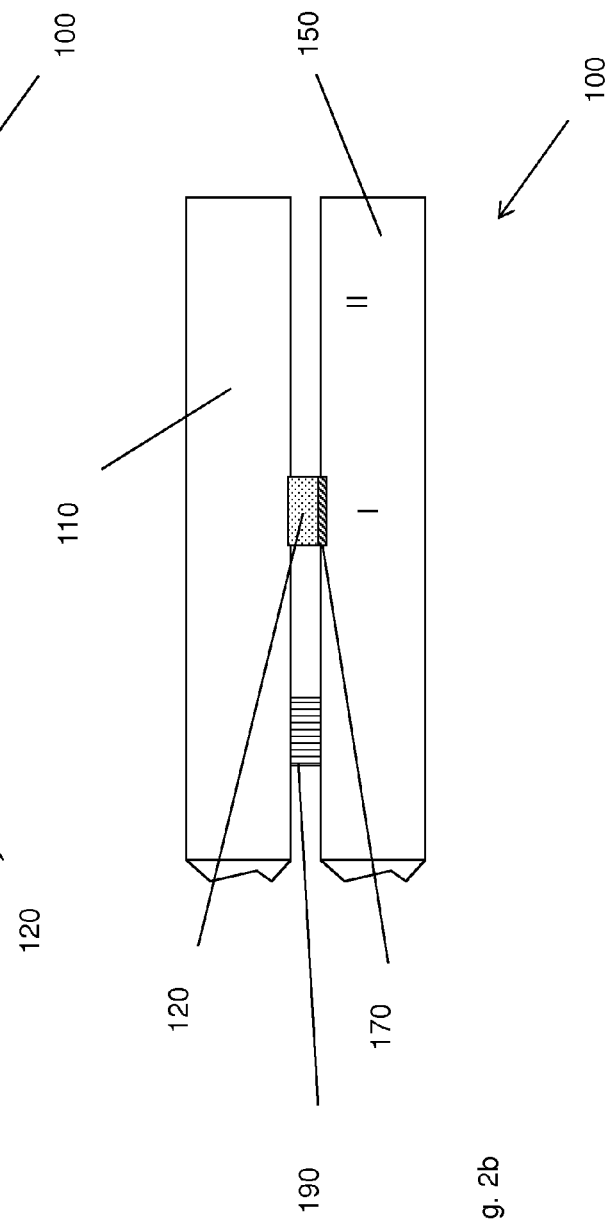

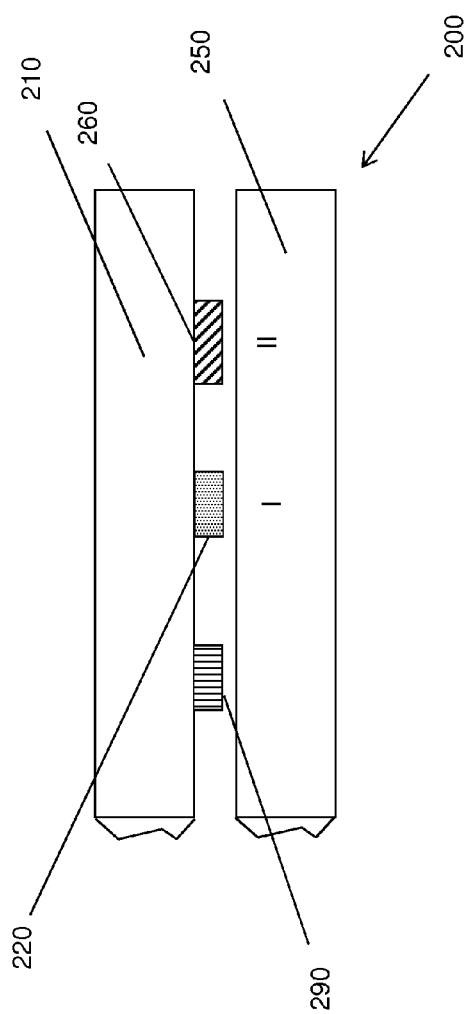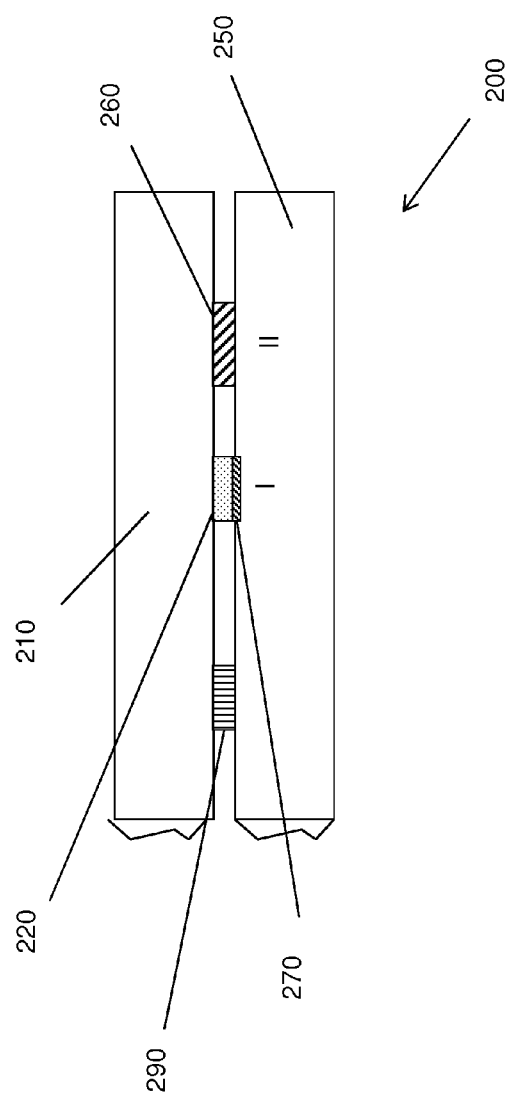

METHOD AND DEVICE USING SILICON SUBSTRATE TO GLASS SUBSTRATE ANODIC BONDING

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a methodology for bonding together two microfabrication substrates.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

Because MEMS devices are often movable, they may be enclosed in a rigid structure, or device cavity formed between two wafers, so that their small, delicate structures are protected from contamination or atmospheric conditions. Many MEMS devices also require an evacuated environment for proper functioning, so that these device cavities may need to be hermetically sealed after evacuation. Thus, the device cavity may be formed between two wafers which are bonded using a hermetic seal, which encloses the MEMS device in a protective and well controlled environment.

Microfabricated optical devices, such as emitters, reflectors, absorbers, gratings, and the like also exist. They may use or manipulate electromagnetic radiation, Such optical devices may require encapsulation in an optically transmissive device cavity to function effectively. Glass wafers would provide such a cavity, allowing electromagnetic radiation to pass into and out of the device cavity. However, a hermetic seal around a glass cavity typically uses a glass frit adhesive, which may require processing temperatures in excess of 400C to melt and fuse the frit. These temperatures may exceed the temperatures that can be withstood by many of the thin metal layers used to create the optical device. Thus, encapsulation of an optical device in a transparent device cavity which is hermetically sealed has been an elusive goal.

It is possible to bond an optically opaque substrate, such as silicon, to an optically transparent substrate such as glass, with the glass substrate forming a lid over the silicon wafer and microfabricated device. Anodic bonding of a silicon substrate to an optically transparent glass substrate is known, wherein voltage and heat are applied between the glass wafer and the silicon wafer. The voltage applied promotes the growth of the oxide layer between the silicon and the glass, which bonds the substrate materials together.

SUMMARY

The systems and methods described here provide an electrically conductive, hermetic bond between a silicon wafer and an optically transparent wafer using an anodic bond. The anodic bond may be accompanied by a second, laterally adjacent bond with an orthogonal or supplemental function, such as better electric conductivity. The method uses ion-rich, nominally conductive optically transparent substrates such as Borofloat® or Pyrex® glass wafers. In one embodiment, the method may include the forming or depositing of a raised feature on at least one of the substrates, and pressing that raised feature against the other substrate to form a substrate pair assembly. The application of temperature and/or voltage to the substrate assembly causes the formation of an oxide layer between the raised feature and the other substrate, which bonds substrates anodically. This anodic bond may be accompanied by a laterally adjacent second bond, which may use a different bonding technology, and may provide, for example, better electric conductivity between the two substrates.

In some embodiments, the raised feature may be a layer of metal material, wherein the metal material is chosen for its ability to form covalent bonds with the material of the ion-rich, optically transparent substrate. When the metal raised metal feature is brought together against the optically transparent substrate, the metal will form covalent bonds and form an oxide layer, wherein that oxide layer bonds the silicon wafer to the optically transparent wafer.

More generally, the method may include providing a first silicon substrate and a second optically transparent substrate, and forming a raised feature on at least one of the silicon substrate and the optically transparent substrate. A layer of metal may be formed on the raised feature, or either the silicon substrate or the optically transparent substrate may patterned or etched to form the raised feature. In any case, the raised feature is then brought in contact with the opposing substrate and a layer of metal oxide is formed between the silicon substrate and the optically transparent substrate. The metal oxide may be the oxidation product of a metal material and the optically transparent substrate. The metal oxide may therefore be disposed between the optically transparent substrate and the metal feature, wherein the metal oxide forms a first anodic bond between the silicon substrate and the optically transparent substrate. A second bond may be disposed laterally adjacent to the anodic bond.

The method described may yield a device including the following attributes: a substrate pair assembly including a first silicon substrate and a second optically transparent substrate, wherein the first substrate and second substrate are bonded together by a first anodic bond and a laterally adjacent second bond. The first anodic bond may further include a raised feature on at least one of the first silicon substrate and the optically transparent substrate, and a layer of metal oxide material wherein the metal oxide is the covalently bonded oxidation product of the metal material and the optically transparent substrate. The metal oxide may bond the silicon substrate to the optically transparent substrate.

Accordingly, the method results in the formation of an anodic bond between a silicon substrate and an optically transparent substrate. The one or more additional bonds may be formed laterally adjacent to the anodic bond. The additional one or more bonds may be a thermocompression bond, a polymer bond, metal alloy bond, a solder bond, or a eutectic bond. Examples of appropriate thermocompression bonding techniques include gold (Au), silver (Ag), or platinum (Pt) and indium (In). The laterally adjacent bond may be selected to provide some additional attribute, for example, hermeticity, electrical conductivity, low RF loss, high adhesive strength, leak resistance, or thermal conductivity, that the anodic bond may lack.

BRIEF DESCRIPTION OF THE DRAWINGS

The present invention will be understood more fully from the following detailed description, and from the accompanying drawings, which however, should not be taken to limit the invention to the specific embodiments shown but are for explanation and understanding only. It should be understood that these drawings do not necessarily depict the structures to scale, and that directional designations such as "top," "bottom," "upper," "lower," "left" and "right" are arbitrary, as the device may be constructed and operated in any particular orientation.

FIGS. 1a, 1b and 1c are simplified cross sectional diagrams of a substrate pair assembly wherein a silicon substrate is anodically bonded to an optically transparent substrate to form a device cavity, using a raised feature on at least one of the silicon substrate and the optically transparent substrate;

FIGS. 2a and 2b are simplified cross sectional diagrams of a substrate pair assembly wherein a silicon substrate is anodically bonded to an optically transparent glass substrate to form a device cavity;

FIGS. 3a and 3b are simplified cross sectional diagrams of a substrate pair assembly wherein a silicon substrate is anodically bonded to an optically transparent glass substrate with a second bond disposed laterally adjacent to the anodic bond;

DETAILED DESCRIPTION

Figure 4B:
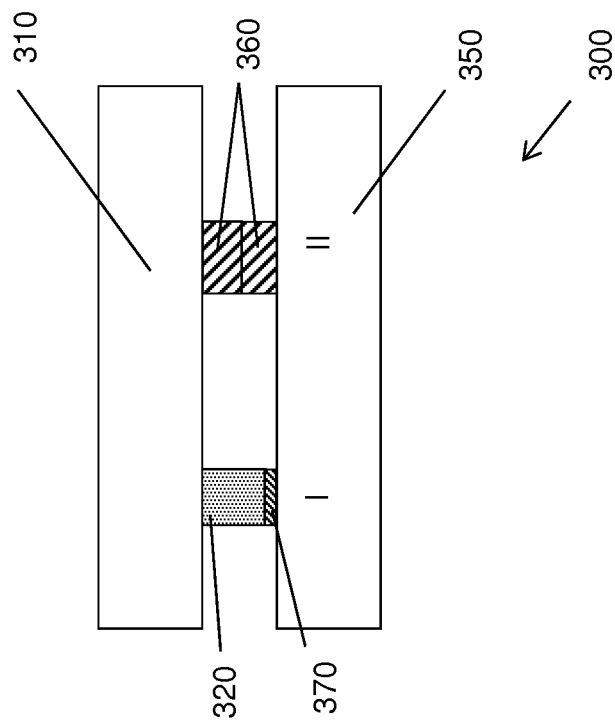
FIGS. 4a and 4b are simplified cross sectional diagrams of a substrate pair assembly wherein the two adhesive layers are patterned on both substrates.

The systems and methods set forth herein are described with respect to a particular embodiment, that of a wafer pair assembly including a silicon substrate anodically bonded to an optically transparent glass substrate. The wafer assembly may include a second bond in addition to the anodic bond. The two bonds may have different attributes or different functions. The first bond may provide a substantially hermetic seal, whereas the second bond may provide electric conductivity, for example. The systems and methods may be extended, however, to any number of additional bonds using other bonding technologies, and having different attributes.

Optically transparent substrates are generally dielectric or insulating, and so they are not appropriate for anodic bonding methods, which generally require voltage to be applied to the surface of the substrate. However, the methods described herein may be used with optically transparent materials which have some nominal conductivity. As such, the methods and devices are particularly suitable with the use of an ion-rich glass such as Borofloat Glass®, Pyrex®, both borosilicate glasses, and fused silica. These types of glass are examples of suitable materials whose electrical conductivity is acceptably close to that of silicon, and which could be anodically bonded to a silicon substrate using the techniques described here. Borofloat Glass®, for example, manufactured by Schott AG, is a highly chemically resistant borosilicate glass with significant conductivity that is produced using the float method, and having a composition of 81% $SiO_2$: 13% $B_2O_3$; 4% $Na_2O/K_2O$; and 2% $Al_2O_3$. Pyrex®, developed by Corning, contains 80.6% $SiO_2$, 12.6% $B_2O_3$, 4.2% $Na_2O$, 2.2% $Al_2O_3$, 0.04% $Fe_2O_3$, 0.1% CaO, 0.05% MgO, and 0.1% Cl.

A material having a "nominal conductivity" should be understood to mean any material whose resistivity is less than about 8 ohm-cm. It should be understood that this selection of materials may be applied to any and all the subsequently described embodiments shown in FIGS. 1-12. As a result of this selection of materials, the glass substrate may be conductive enough to support the application of the applied field by allowing the movement of sufficient charge to flow within the material, to allow the anodic bond to form. Although the techniques described below use an optically transparent substrate, it should be understood that the techniques may also be applied to nominally insulating, though weakly conductive dielectric wafers that are not optically transparent, or which are optically transparent but have been coated with an optically opaque or reflective layer.

By the term "substantially hermetic," seal or bond, it should be understood that the bond may be a large though not perfect barrier to the transmission of particles and gases across the bondline. For example, leak rates of less that about 1 Torr/hour into the approximately 25 uliter volume of the device cavity is considered to be "substantially hermetic." In addition, the substantially hermetic bondline may be understood to be impenetrable by particles of about 1 um or greater, in diameter.

In the art, the term "wafer" is generally understood to refer to a generally circular, thin disk of material upon which a plurality of microfabricated devices may be fabricated. The word "substrate" may be understood to refer to any supporting surface, such as a wafer for example, or a wafer after the microfabricated devices have been singulated. The terms "wafer" and "substrate" have been used interchangeably herein, even though wafer generally suggests an intact, circular surface. They should both be understood to mean a supporting surface on which one or more microfabricated structures have been built. Specifically, "wafer" should be understood to include any portion of the intact, circular fabrication material, including singulated devices which have been separated from the intact, generally circular, fabrication material.

Several embodiments of the method and device are described below, however these examples are not meant to be exhaustive, and other options may exist. FIGS. 1a-1c shows a simple anodic bond between a silicon wafer 10 and an optically transparent wafer 50, wherein the anodic bond uses a raised feature 20 on one, the other, or both substrates; FIGS. 2a and 2b show the generation of the anodic bond with a metal raised feature on a silicon wafer; FIGS. 3a-9 show the anodic bond in addition to a laterally disposed adjacent bond; FIGS. 10-12 show bonding conditions under which the two bonds may be formed.

FIGS. 1a-1c illustrate different approaches to the formation of a device cavity sealed with an anodic bond between a silicon wafer 10 and a substantially dielectric, optically transparent wafer 50. A raised feature 20 may define the perimeter of the device cavity which will enclose a microfabricated device (shown generically as reference number 90 in FIGS. 1a-1c). The raised feature 20 will also define the bond line between the silicon wafer 10 and the optically transparent wafer 50, and will participate directly in the bonding between the two wafers. The raised feature 20 may be formed on the silicon wafer (FIG. 1a), or on the optically transparent wafer (FIG. 1b), or on both (FIG. 1c). Any or all of these approaches may then be combined with a second, laterally adjacent bond, as described further below.

FIG. 1a is a simplified schematic cross sectional diagram of a substrate pair assembly prior to bonding. In FIG. 1a, a silicon wafer 10 is to be anodically bonded to an optically transparent wafer 50. A microdevice 90 may have been previously fabricated on the optically transparent wafer, 50, or more likely on the silicon wafer 10 as shown. The microdevice 90 is to be enclosed in a device cavity formed between the two wafers 10 and 50, as defined by a hermetic seal around the microdevice 90. The hermetic seal may be the anodic bond.

To bond the wafers anodically, the raised feature 20 is formed. The raised feature 20 may be a layer of metal, perhaps a layer of silicon, which is formed or deposited on silicon wafer 10. The raised feature 20 may be any metal capable of forming an oxide with the material of the optically transparent substrate 50. Examples of suitable metal materials include of titanium (Ti), chromium (Cr), silicon (Si), cobalt (Co), aluminum (Al) and zirconium (Zr), but there may be others and this list is not meant to be exhaustive. Alternatively, a raised feature of silicon can be formed by etching or removing material adjacent to the raised feature 20 to form a depression or cavity adjacent the raised feature 20. Alternatively, the raised feature 20 may be a layer of silicon, deposited on substrate 10. In any case the raised feature 20 may be at least about 500 nm thick and about 100 microns wide. The configuration is illustrated in FIG. 1a "before bonding."

To bond wafers 10 and 50, the wafers are pressed together such that the raised feature 20 is pressed against the surface of the optically transparent wafer 50 in a wafer bonding chamber. Conditions in the wafer bonding chamber are set to promote oxidation of the raised feature 20 with the material of the optically transparent substrate 50. A voltage may be applied between the wafers, and the temperature and/or pressure within the wafer bonding chamber may be raised. As mentioned previously, the optically transparent substrate 50 may be chosen of a material with sufficient conductivity to support a voltage potential between the silicon substrate 10 and the optically transparent substrate 50. Accordingly, an oxide layer 70 may be formed between the raised feature 20 on the silicon wafer 10, and the optically transparent substrate 50. The oxide layer 70 may serve to bond the raised feature 20 on the silicon wafer 10 to the optically transparent wafer 50, as shown "after bonding" in FIG. 1a.

FIG. 1b illustrates another exemplary embodiment, wherein the raised feature 20 is formed on the optically transparent substrate 50 rather than on the silicon substrate 10. The raised feature may be formed prior to bonding as shown in FIG. 1b, "before bonding." In either case, the raised feature may define the bonding area, and may be raised relative to a laterally adjacent area which may form the device cavity. The oxide layer 70 may bond the raised feature 20 of the optically transparent substrate 50 to the surface of the silicon substrate 10, as shown "after bonding."

FIG. 1c illustrates another exemplary embodiment, wherein the raised feature 20 is formed on both the optically transparent substrate 50 as well as on the silicon substrate 10. The raised features may be formed prior to bonding as shown in FIG. 1c, "before bonding." As before, the raised feature defines the bonding area, and is raised relative to a laterally adjacent area on either one or both of the silicon wafer 10 and the optically transparent wafer 50. The oxide layer 70 may bond the raised feature 20 of the optically transparent substrate 50 to the raised feature of the silicon substrate 10, as shown "after bonding."

FIGS. 2a and 2b depict the bonding of substrate pair assembly using an anodic bond, as was shown in FIG. 1a, in greater detail. FIG. 2a is a simplified cross sectional diagram of a silicon substrate 110 and an optically transparent substrate 150 which together form a substrate pair 100. FIG. 2a illustrates the substrate pair 100 prior to bonding. The upper substrate 110 may be the silicon substrate and may have the raised feature 120 formed thereon. In substrate pair 100, the raised feature 120 may be a layer of metal 120, wherein the layer of metal 120 is disposed adjacent to a microfabricated device 190. The raised feature may also define a device cavity that will enclose the microfabricated device 190.

As before, the raised feature, metal layer 120, may be any metal capable of forming an oxide with the material of the optically transparent substrate 150. Examples of suitable metal materials include titanium (Ti), chromium (Cr), silicon (Si), cobalt (Co), aluminum (Al) and zirconium (Zr), but there may be others and this list is not meant to be exhaustive.

A suitable deposition method may be sputter deposition using a silicon target, or chemical vapor deposition to make the raised feature 120. Alternatively, a depressed area may be etched or relieved to a depth of about 500 nm, such that the raised feature 120 remains adjacent to the depression. In either case, the result is a layer of metal at least about 500 nm thick.

The microfabricated device 190 may be formed on the silicon substrate 110 or a optically transparent substrate 150. The microfabricated device may be virtually any integrated circuit or MEMS device, but devices which absorb, reflect, transmit, focus, emit or attenuate electromagnetic radiation may benefit particularly from the systems and methods presented here. In addition to the microfabricated device 190, there may be electrical traces (not shown) on either the silicon substrate 110 or the optically transparent substrate 150. In some embodiments, it may be necessary or convenient to have electrical conductivity between traces formed on the upper substrate and traces formed on the lower substrate. The metal layer 120 may provide this conductivity. An exemplary microfabricated device may be, for example, the infrared emitter described in U.S. Pat. No. 7,968,986, issued Jun. 28, 2011 and incorporated by reference herein in its entirety.

With the metal layer raised feature 120 formed thereon, the silicon substrate 110 may be brought into contact with a optically transparent substrate 150 to form the substrate pair assembly 100. Pressure may be applied between the wafers, as well as a combination of heat and voltage. The conditions may be chosen to promote the formation of a layer of metal oxide 170 between the metal layer raised feature 120 and the optically transparent substrate 150. This oxide layer 170 may be on the order of about 10 nm or more in thickness. The final thickness may be a function of the temperature, voltage and pressure applied to the substrate pair assembly 100, and the duration for which these conditions are applied. The oxide layer 170 may be formed in a wafer bonding chamber which is equipped to provide these conditions to the wafer pair 100.

While this embodiment is described with respect to a metal layer raised feature 120, it should be understood that the invention may also be practiced with the raised feature on the optically transparent substrate, as depicted in FIG. 1b or 1c. The only requirement is that the raised feature be capable of forming a metal oxide layer with the materials of the optically transparent substrate, either by itself (in the case where the raised feature includes a metal material (as in FIGS. 1a and 2a), or by virtue of a metal material in contact with the raised feature (as in FIGS. 1b and 1c).

Accordingly, the substrate pair may be bonded anodically by the formation of a metal oxide 170 between a first substrate 110 and an optically transparent substrate 150. The first substrate 110 may be silicon, the raised feature may be a deposited metal layer, and the optically transparent substrate may be Borofloat® glass, for example, or any optically transparent substrate material which is also nominally conductive.

Upon removal from the wafer bonding chamber, the wafer pair assembly 100 may look as shown in FIG. 2b. The anodic bond is formed by the metal layer 120 and its associated oxide layer 170. This anodic bond may form a perimeter around the microfabricated device 190, enclosing it in a protective device cavity. This anodic bond may have other advantageous features, such as hermeticity, or may provide electrical conductivity between substrates 110 and 150. Depending on the application, the anodic bond may be accompanied by a second bond placed laterally adjacent to the anodic bond, and techniques for forming this laterally adjacent second bond are described next, with respect to FIGS. 3-12, below.

FIG. 3a shows a second embodiment of the substrate pair assembly 200 using a second, laterally adjacent bond 260. As before, an anodic bond may be formed as an oxide layer 270 between the silicon substrate 210 and the optically transparent substrate 250. However, as illustrated in FIG. 3a, in addition to the anodic bond, there may be another, laterally displaced second bond 260 formed also between the wafers in the substrate pair assembly 200. In this and subsequent figures, the number "I" designates the anodic bond and the number "II" denotes the second bond. The anodic bond I may be formed before or after the second bond II, so the numbers "I" and "II" do not necessarily correspond to the order of formation. The second bond II may be laterally separated from the anodic bond I by a distance or, for example, about 100 microns or more.

It should be understood that although first bond I is shown on the left of second bond II and thus closer to the microdevice 290, this is not necessarily the case. Second bond II, and indeed any further bonds III and IV, may be disposed inboard (relative to microdevice 290) of first anodic bond I. The descriptors "right," "left," "inner," "outer," are arbitrary, and the bonds may be arranged in any way relative to one another.

The second bond II may use, for example, a polymer, thermocompression, metal alloy, eutectic, a solder, or a metal alloy to adhere the surfaces. Examples of appropriate thermocompression bonding technologies include gold (Au), silver (Ag), or platinum (Pt). and indium (In). Again, this list is not meant to be exhaustive. For solder or polymer bonds, the separation between the bond lines may be less than 100 microns because the bonding material partially liquefies during the process, making the material compliant and spreading it laterally by some amount.

In analogy with FIGS. 2a and 2b, the microfabricated device 290 may be disposed in a device cavity defined by an anodically bonded metal layer 220. This metal layer 220 may join a silicon substrate 210 to an optically transparent substrate 250 by virtue of metal oxide layer 270. The second bond 260 may be formed on either the silicon substrate 110 or the optically transparent substrate 250 or both. The second bond features 260 may be patterned to have a particular shape and dimensions. Although the microfabricated device 290 is not shown explicitly in all FIGS. 1-12, it should be understood that a microfabricated device may be disposed in the device cavity defined by the one or more bondlines.

Upon removal from the wafer bonding chamber, the wafer pair assembly 200 may look as shown in FIG. 3b. The anodic bond I is formed by the metal layer 220 and its associated oxide layer 270. This anodic bond I may form a perimeter around the microfabricated device 290, enclosing it in a protective device cavity. This anodic bond I may have other advantageous features, such as substantial hermeticity, or may provide substantial electrical conductivity between the silicon substrate 210 and the optically transparent substrate 250.

The second bond II technology may be chosen to have different attributes than the first bond I technology. For example, the second bond II technology may be chosen to provide superior mechanical strength, whereas the first bond I technology may be chosen to provide a defined conductive path between the silicon 210 and the optically transparent substrate 250. More generally, the first bonding mechanism I may have an attribute selected from the group of hermeticity, electrically conductivity, low RF loss, high adhesive strength, leak resistance, thermal conductivity, and the second bond II may provide a second, different attribute chosen from the same group.

In FIG. 3b, the substrate pair assembly 300 is shown in the finished condition. In FIG. 3b, an oxide layer 370 has been formed between the raised feature 320 and the optically transparent substrate 350. As before, the raised feature 320 may be a layer of silicon formed on the silicon substrate 310, such that the metal oxide 370 is silicon dioxide $SiO_2$. As seen in FIG. 3b, the second bond II has also been formed between the substrates. Second bond II may be formed before, at the same time, or after anodic bond 1, depending on what bonding conditions are chosen and how they are applied. Various possible protocols for forming bond I and bond II are described below with respect to FIGS. 10-12.

Figure 4A:
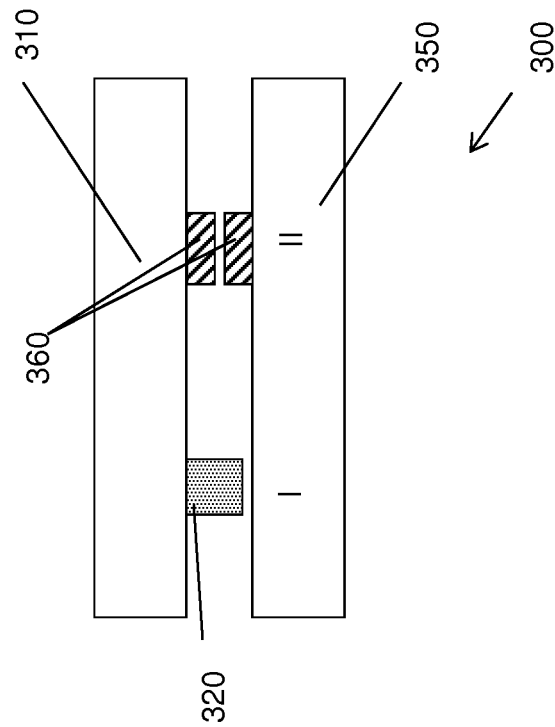

FIG. 4a shows further dimensional details of the substrate pair assembly 300. In substrate pair assembly 300, the silicon substrate 310 may again be joined to an optically transparent substrate 350 by a first anodic bond I. The anodic bond I may be formed from metal layer 320, joined to the optically transparent substrate 350 by an oxide layer. The oxide layer is not shown in FIG. 4a, because substrates 310 and 350 are shown prior to bonding, and the oxide layer has not yet been formed. A laterally disposed second bond 360 may also join the silicon substrate 310 and the optically transparent substrate 350. In this embodiment, all bond features 320 and 360 may be patterned and may have specific dimensions. As shown in FIG. 4a, the two components 360 of the second bond II may have about the same thickness as the component 320 of the first anodic bond I. As a result, the surfaces of the second bond II may make contact at about the same time as the surfaces of the anodic bond I. The bond components need not have similar dimensions, however, and may be chosen instead with other considerations in mind, as discussed below with respect to FIGS. 5-8.

In FIG. 4b, the substrate pair assembly 300 is shown in the finished condition. In FIG. 4b, an oxide layer 370 has been formed between the raised feature 320 and the optically transparent substrate 350. As before, the raised feature 320 may be a layer of silicon formed on the silicon substrate 310, such that the metal oxide 370 is silicon dioxide $SiO_2$. As seen in FIG. 4b, the second bond II has also been formed between the substrates. Second bond II may be formed before, at the same time, or after anodic bond I, depending on what bonding conditions are chosen and how they are applied. Various possible protocols for forming bond I and bond II are described below with respect to FIGS. 10-12.

In FIGS. 4a and 4b, the components of the first anodic bond 320 are generally of the same size as the components of the second bond 360. Thus, the surfaces of first bond 320 may make contact at about the same time as the two components of second bond 360. It may be advantageous in some cases, however, to make the components different, as described below with respect to FIG. 5.

Figure 5:
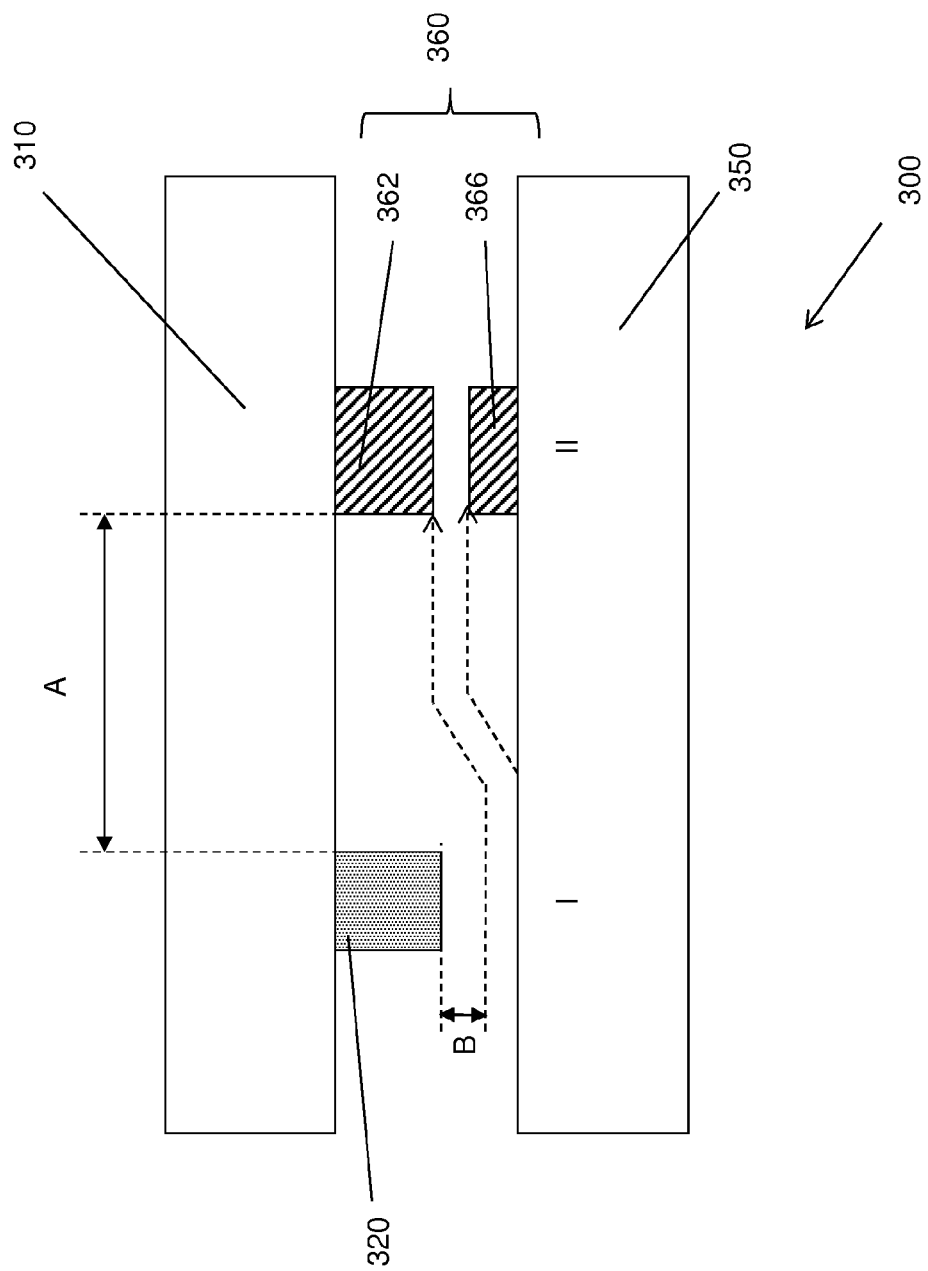
FIG. 5 is a simplified cross sectional diagram of a substrate pair assembly showing a height mismatch between the two patterned features on the substrates.

FIG. 5 shows further dimensional detail of substrate pair assembly 300 wherein the dimensions of the various features are not the same, but are instead chosen with the bonding methodology in mind. In analogy with FIGS. 2a and 2b, the microfabricated device (not shown) may be disposed in a device cavity defined by an anodically bonded metal layer 320, This metal layer 320 may join a silicon substrate 310 to an optically transparent substrate 350 by virtue of a metal oxide layer between metal layer 320 and the second substrate 350. The oxide layer is not shown in FIG. 5, because substrates 310 and 350 are shown prior to bonding, and the oxide layer has not yet been formed. The second bond layer 360 may also join the first substrate 310 to the second substrate 350. Either the silicon substrate 310 or the optically transparent substrate 350 or both may be patterned lithographically. The bond features 320 and 360 may be patterned to have the particular shape and dimensions shown in FIG. 5.

As shown in FIG. 5, it may be advantageous to form 320, the components of the first bond I to have different shapes compared to its counterpart 362 of the second bond II. In particular, the thickness of anodic metal layer 320 may be different than the thickness of the second bonding layer 362. More specifically, for a given lateral displacement between the bond lines, the total thickness of bonding layers 362 and 366 may be greater than the thickness of bonding element 320 by an amount B. Accordingly, the vertical distance B corresponds to the amount of additional travel between substrates 310 and 350 before a first contact is made between anodic bonding layer 320 and lower substrate 350. As can be seen in FIG. 5, upper layer 362 may contact lower layer 366 before anodic bonding layer 320 contacts the lower substrate 350. Thus, the bonding force on 320 may depend on the distance between the first bond line I and the second bondline II, as some of this bonding force is supported by the compliance of the substrate 310 across the lateral distance between the two bondlines. This lateral displacement is denoted as "A" in FIG. 5. Generally, for commonly used glass substrates having a thickness of about 500 microns, a ratio of A/B of around 50 may be appropriate. Accordingly, in this situation and depending on the compliance of the silicon substrate 310, the pressure on the second set of bonding elements 362 and 366 may exceed the pressure on the first anodic bonding element 320. For this reason, formation of the second bond II may precede formation of the first bond.I. However, the order of the bonding may be further influenced by conditions in the bonding chamber as described further below.

At bonding, an oxide layer will have been formed between the silicon substrate 310 and the optically transparent substrate 350, but the oxide layer is not shown in FIG. 5 because the substrates are shown prior to bonding. The finished condition of substrate pair assembly 300 is generally as was shown in FIG. 4b. As before, the raised feature 320 may be a layer of silicon formed on the silicon substrate 310, such that the metal oxide 370 may be silicon dioxide $SiO_2$. As was seen in FIG. 4b, the second bond II has also been formed between the substrates. Second bond II may be formed before, at the same time, or after anodic bond 1I depending on what bonding conditions are chosen and how they are applied. Various possible protocols for forming bond I and bond II are described below with respect to FIGS. 10-12.

Figure 6:
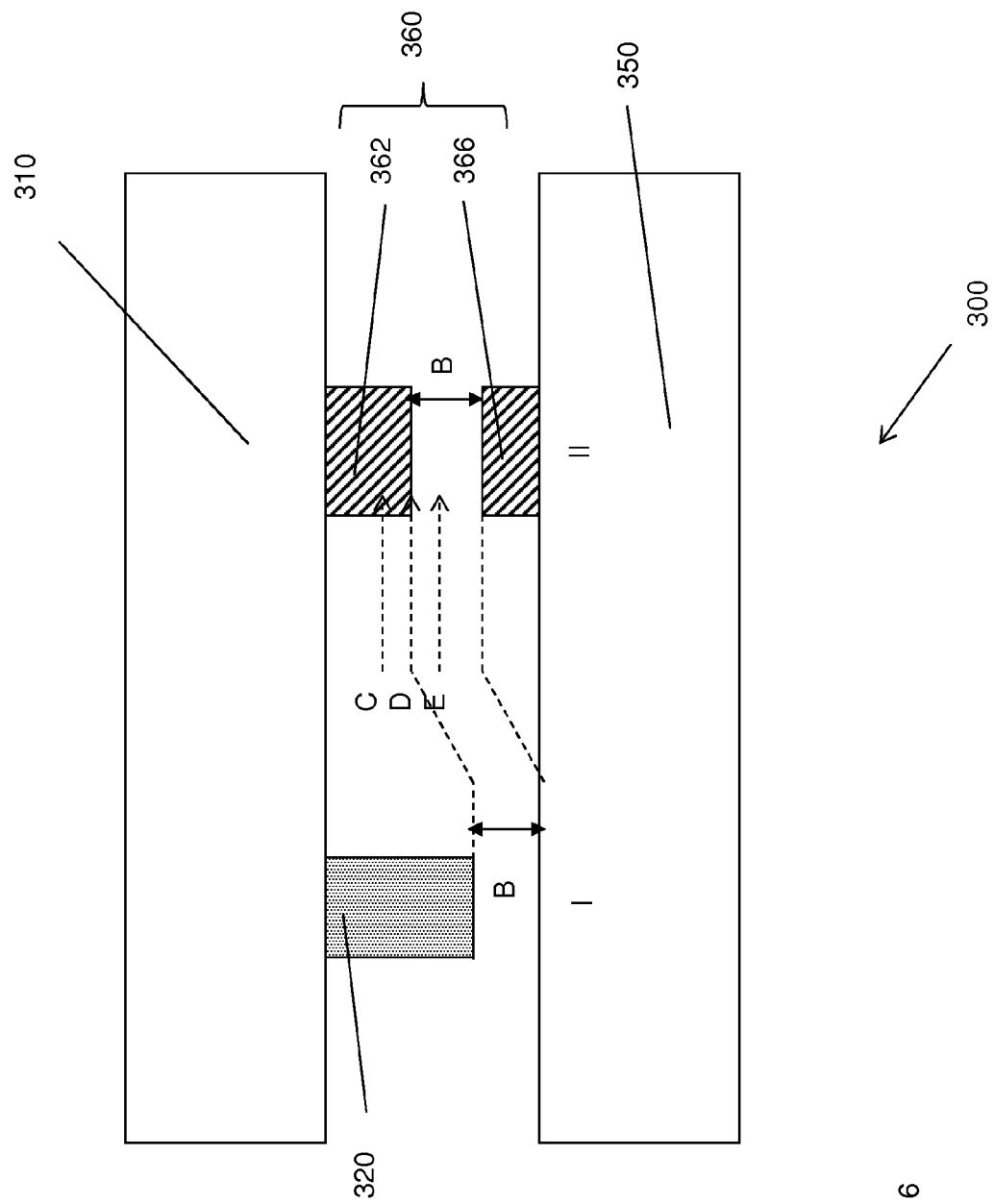
FIG. 6 is a simplified cross sectional diagram of a substrate pair assembly showing a range of height mismatches between a first patterned feature and a second patterned feature.

An even more general situation with respect to the dimensioning of substrate pair assembly 300 is shown in FIG. 6. As before, elements 320 and 360 correspond to the elements of the first and the second bondlines on the silicon and optically transparent substrates, respectively. The anodic element 320 may be thinner (C), the same thickness as (D), or thicker (E) than the combined thicknesses of the first element 362 and the second element 366 of the second bondline 360. This relative height may determine the order of the contact of the respective surfaces, but may not determine the order of the bonding mechanisms I and II. In one embodiment, the thickness of the anodic metal layer 320 may be about 50 nm thinner than the components of the second bondline, such that the components of the second bondline 360 make first contact. In this case, the second bondline may be displaced laterally from the first by about 500 nm. The bonding force on the metal bonding element 320 will then depend on the compliance of the silicon substrate 310. In other words, the ratio of height mismatch to offset between the bondlines may be about 1:10 to 1:50, but will depend on the compliance of the silicon substrate 310.

At bonding, an oxide layer will have been formed between the silicon substrate 310 and the optically transparent substrate 350, but the oxide layer is not shown in FIG. 6 because the substrates are shown prior to bonding. The finished condition of substrate pair assembly 300 is generally as was shown in FIG. 4b. As before, the raised feature 320 may be a layer of silicon formed on the silicon substrate 310, such that the metal oxide 370 is silicon dioxide $SiO_2$. As was seen in FIG. 4b, the second bond II has also been formed between the substrates. Second bond II may be formed before, at the same time, or after anodic bond I, depending on what bonding conditions are chosen and how they are applied. Various possible protocols for forming bond I and bond II are described below with respect to FIGS. 10-12.

Figure 7:
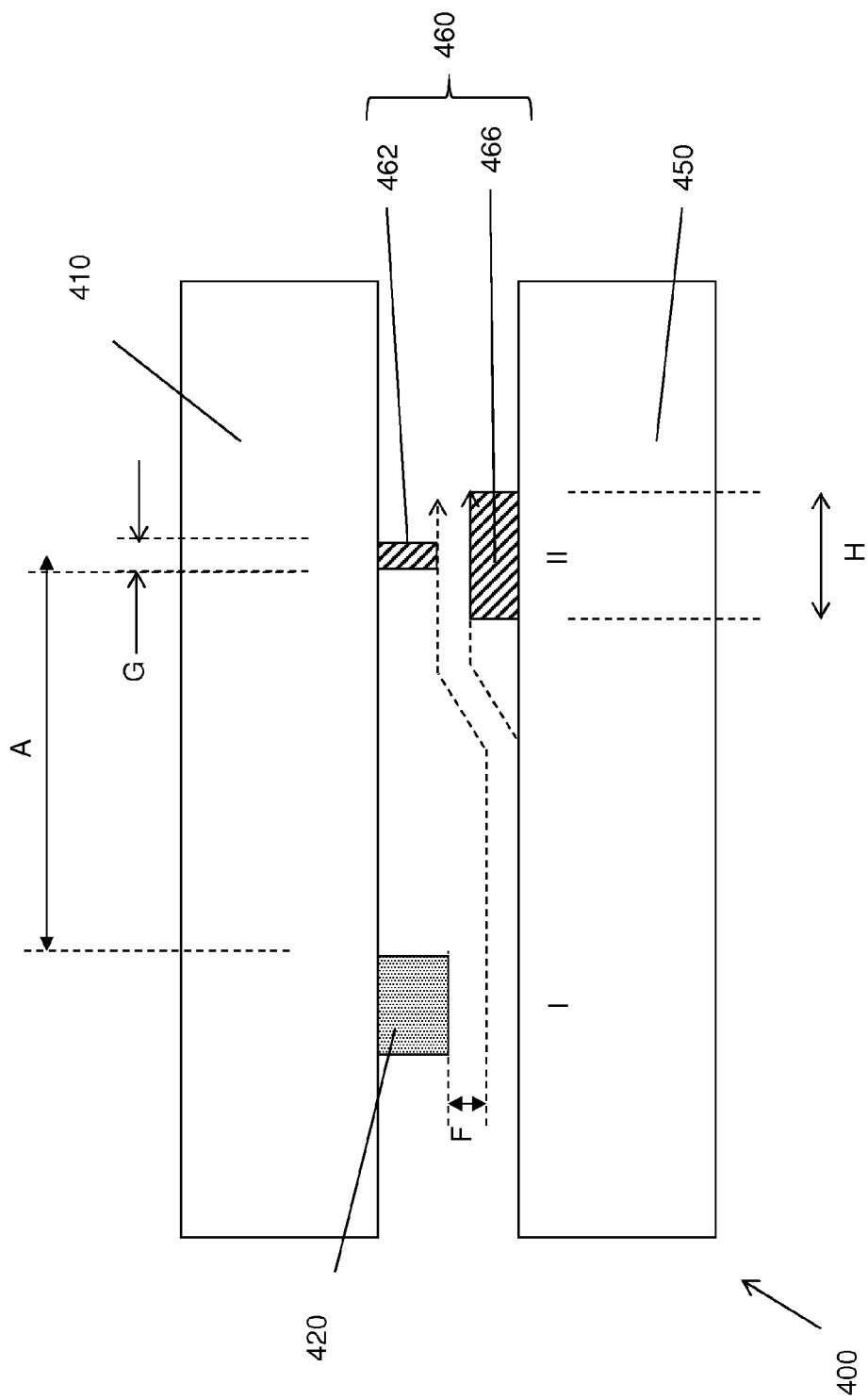
FIG. 7 is a simplified cross sectional diagram of a substrate pair assembly wherein one of the patterned features is formed of a size to concentrate pressure on this feature to form the bond.

FIG. 7 shows another embodiment of the substrate pair assembly 400, with yet another approach to the dimensioning of the components of the first anodic bond I and the second bond II. As before, the microfabricated device (not shown) may be disposed in a device cavity defined by an anodically bonded metal layer 420. Anodic metal layer 420 may be disposed on the first silicon substrate 410. Upon bonding with lower substrate 450, this layer 420 forms an oxide layer which bonds the metal layer, and thus the upper substrate 410, to the lower substrate 450. Because FIG. 7 shows the substrates 410 and 450 prior to bonding, the oxide layer is not shown, because the oxide layer has not yet been formed. The second bond layer 460 may also join the first substrate 410 to the second substrate 450.

Similar to FIGS. 5 and 6, the second bond layer 460 may be formed of a first feature 462 and a second feature 466 on the first substrate 410 and the second substrate 450, respectively. The second bond features 462 and 466 may be patterned to have the particular shape and dimensions as shown in FIG. 7. The first silicon substrate 410 or the second optically transparent substrate 450 may be joined by the adhesive action of the first bond I and the second bond II.

In this embodiment, the first feature of the second bonding technology 462 is patterned to have smaller dimensions than the feature 420 of the first bonding technology and smaller than second feature 466 of the second bonding technology. By making the first feature 462 smaller, the pressure applied by feature 462 is commensurately higher than the pressure on the first feature 420 of the first bond I.

More specifically, for a given lateral displacement A between the bond lines, the thickness of bonding layers 462 and 466 may be greater than the thickness of bonding element 420 by an amount F. Accordingly, the vertical distance F corresponds to the amount of additional travel between substrates 410 and 450 before a first contact is made between anodic bonding layer 420 and lower substrate 450.

If the bonding speed depends only on pressure, the second bond II will be formed before the first bond I. In particular, when the first feature 462 contacts the second feature 466, the substrates must deform by an additional distance F before contact is made between the feature 420 and the lower substrate 450. Feature 462 may also have a width G which may be thinner than the corresponding width H of the second feature of the second bonding technology 466. Accordingly, there may be more pressure on the second bondline 460 in comparison to the first bondline 420. All other things being equal, the second bond II may precede the first anodic bond I. However, as described in more detail below, other parameters may be controlled to determine the order of the bonding for substrate pair assembly 400.

At bonding, an oxide layer will have been formed between the silicon substrate 410 and the optically transparent substrate 450, but the oxide layer is not shown in FIG. 7 because the substrates are shown prior to bonding. The finished condition of substrate pair assembly 400 is generally as was shown in FIG. 4b. As before, the raised feature 420 may be a layer of silicon formed on the silicon substrate 410, such that the metal oxide is silicon dioxide $SiO_2$. As was seen in FIG. 4b, the second bond II has also been formed between the substrates. Second bond II may be formed before, at the same time, or after anodic bond I, depending on what bonding conditions are chosen and how they are applied. Various possible protocols for forming bond I and bond II are described below with respect to FIGS. 10-12.

Figure 8:
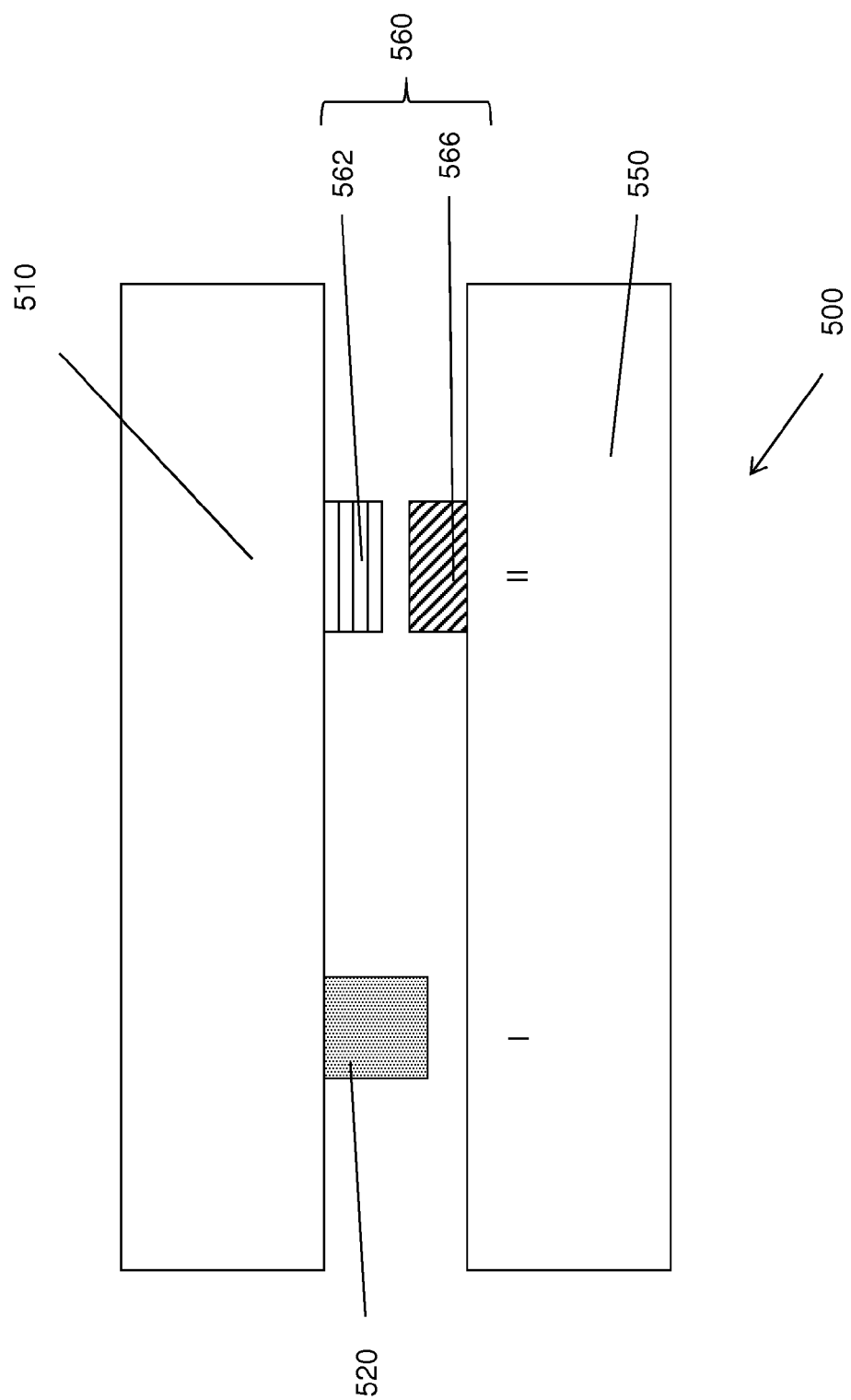
FIG. 8 is a simplified cross sectional diagram of a substrate pair assembly wherein one of the patterned features is a multilayer structure.

FIG. 8 shows another embodiment of the substrate pair assembly 500. As before, the microfabricated device (not shown) may be disposed in a device cavity defined by an anodically bonded metal layer and raised feature 520. As before, this raised feature 520 may be formed on the silicon substrate 510 and/or on a second optically transparent substrate 550. This metal layer 520 may join the silicon substrate 510 to a second optically transparent substrate 550 by virtue of a metal oxide layer. The metal oxide layer is not shown in FIG. 8, because substrates 510 and 550 are shown prior to bonding, and the oxide layer has not yet been formed. A second bond layer 560 may also join the first substrate 510 to the second substrate 550. The second bond layer 560 may be formed of a first feature 562 and a second feature 566 on the first substrate 510 and the second substrate 550, respectively. The second bond features 562 and 566 may be patterned to have the particular shape and dimensions as was shown in FIG. 5. The silicon substrate 510 or the optically transparent substrate 550 may be joined by the adhesive action of the first bond 1 and the second bond 2.

In this embodiment, the first feature of the second bonding technology 562 may be a patterned multilayer 562. The multilayer may have a compliance that is determined by the materials and dimensions of the multilayer 562. This multilayer feature 562 may also be thinner or thicker than the feature 520 of the first bonding technology. By making the first feature 562 more compliant, this feature 562 may make first contact. Nonetheless, the second bond may not necessarily precede the first bond, because the compliance of the multilayer may limit the pressure between 562 and 566 as the two substrates 510 and 550 are squeezed together.

Examples of the embodiment illustrated in FIG. 8 include any two or three metals that have a eutectic point of 400 Centigrade or less, such as silicon/gold, silicon\molybdenum, silicon\silver. Alternatively, multilayers which can form a thermocompression bond may be used, including silver\silver, gold\gold, silver\gold, for example. In another alternative, low temperature solder bonding materials may be used, such as indium\gold, indium\silver, gold-tin/gold-copper-silver, indium\copper, antimony-lead/gold-copper-silver, just to name a few. Each layer in the multilayer stack may have a thickness of about 1-10 microns or more.

At bonding, an oxide layer will have been formed between the silicon substrate 510 and the optically transparent substrate 550, but the oxide layer is not shown in FIG. 8 because the substrates are shown prior to bonding. The finished condition of substrate pair assembly 500 is generally as was shown in FIG. 4b. As before, the raised feature 520 may be a layer of silicon formed on the silicon substrate 510, such that the metal oxide is silicon dioxide $SiO_2$. As was seen in FIG. 4b, the second bond II has also been formed between the substrates. Second bond II may be formed before, at the same time, or after anodic bond I, depending on what bonding conditions are chosen and how they are applied. Various possible protocols for forming bond I and bond II are described below with respect to FIGS. 10-12.

Figure 9:
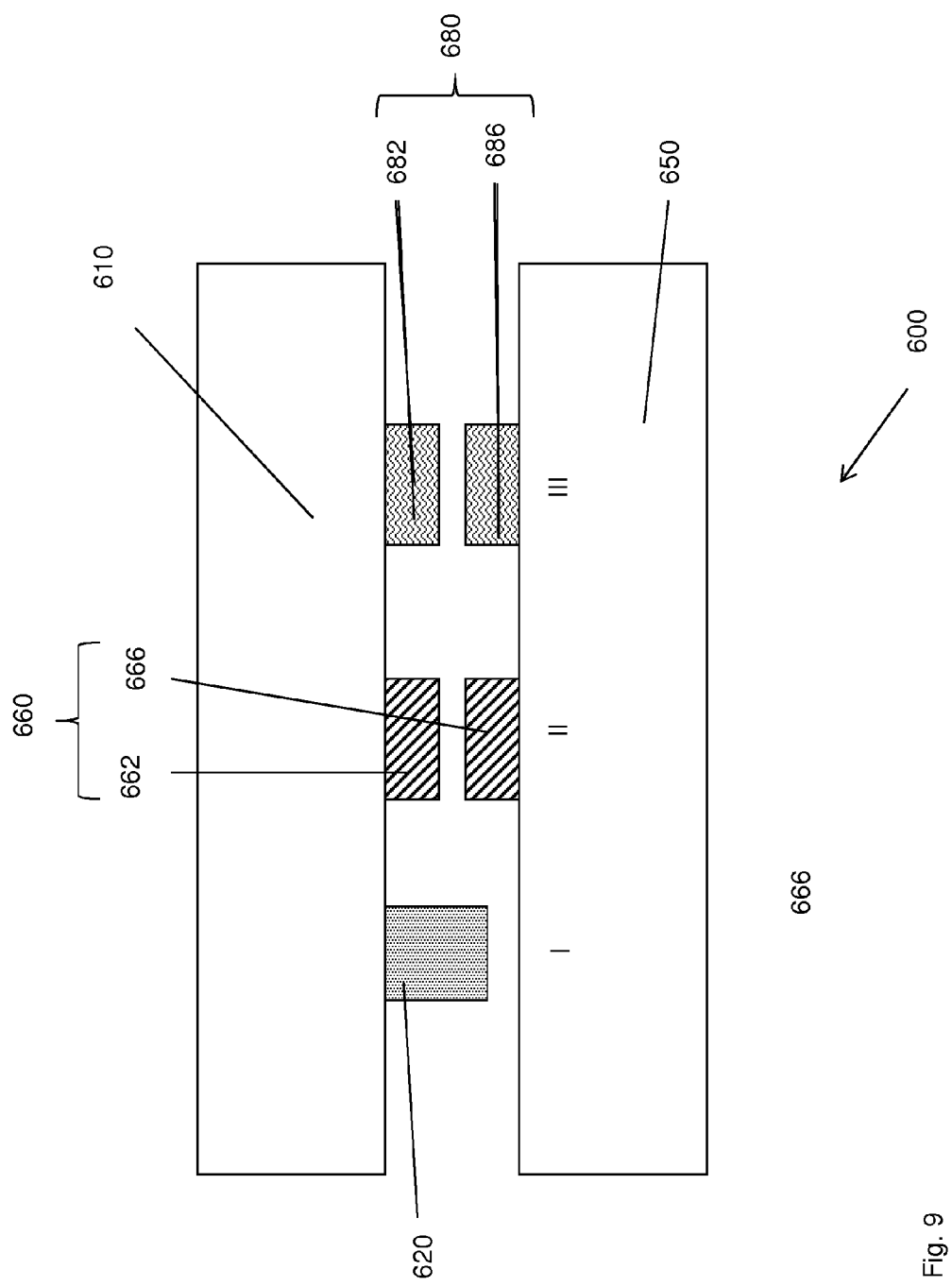
FIG. 9 is a simplified cross sectional diagram of a substrate pair assembly showing a third bond spaced laterally from the second bond.

FIG. 9 shows another embodiment of the substrate pair assembly 600, wherein a third bond III participates with the first anodic bon I and the second bond II to join the silicon substrate 610 and the optically transparent substrate 650. As before, the microfabricated device (not shown) may be disposed in a device cavity defined by an anodically bonded metal layer 620. A metal oxide layer may join the silicon substrate 610 to an optically transparent substrate 650. The oxide layer is not shown in FIG. 9, because substrates 610 and 650 are shown prior to bonding, and the oxide layer has not yet been formed. The second bond layer 660 may also join the first substrate 610 to the second substrate 650. The second bond layer 660 may be formed of a first feature 662 and a second feature 666 on the first substrate 610 and the second substrate 650, respectively. The second bond features 662 and 666 may be patterned to have the particular shape and dimensions shown in FIG. 4. The silicon substrate 610 or the optically transparent substrate 650 may be joined by the adhesive action of the first bond I and the second bond II.

In this embodiment, a third bonding technology III may be employed in addition to the first two bonding technologies I and II. The third bonding technology III may be, for example, a polymer, thermocompression, metal alloy, eutectic, a solder, a metal alloy and a eutectic bond. The first feature 682 of the third bonding technology 680 may be a patterned multilayer or dimensioned as described previously with respect to FIGS. 3-7. A corresponding feature 686 may be disposed on the second substrate to form the third bond 680 along with the first feature 682.

At bonding, an oxide layer will have been formed between the silicon substrate 610 and the optically transparent substrate 650, but the oxide layer is not shown in FIG. 9 because the substrates are shown prior to bonding. The finished condition of substrate pair assembly 600 is generally as was shown in FIG. 4b. As before, the raised feature 620 may be a layer of silicon formed on the silicon substrate 610, such that the metal oxide is silicon dioxide $SiO_2$. As was seen in FIG. 4b, the second bond II has also been formed between the substrates, along with third bond III. Third bond III and second bond II may be formed before, at the same time, or after anodic bond I, depending on what bonding conditions are chosen and how they are applied. Various possible protocols for forming bonds I, II and III are described below with respect to FIGS. 10-12.

It should be understood that the concepts disclosed here may be extended to any number of additional bonding technologies. Each of the technologies may be employed for the same or a different purpose, and may be selected for the following attributes: hermeticity, electrical conductivity, low RF loss, high adhesive strength, leak resistance, thermal conductivity. The attributes for each bonding technology I, II, and III may be the same, or they may be different.

Figure 10A:
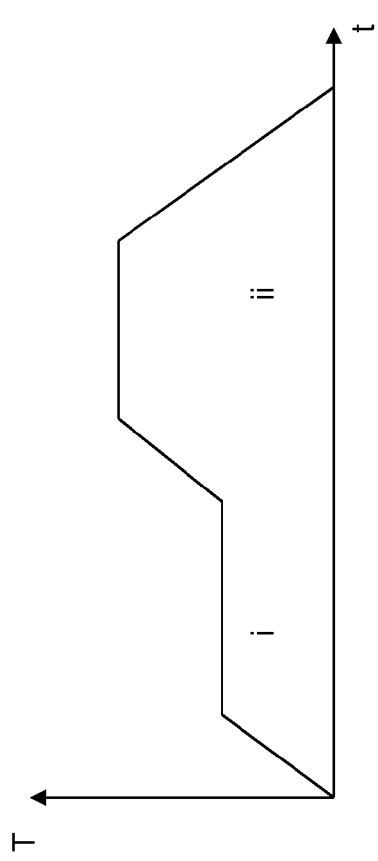
FIGS. 10a and 10b are simplified profiles of a first set of exemplary bonding conditions, wherein one bond is formed under one set of conditions and the other bond is formed under the second set of conditions.
Figure 10B:
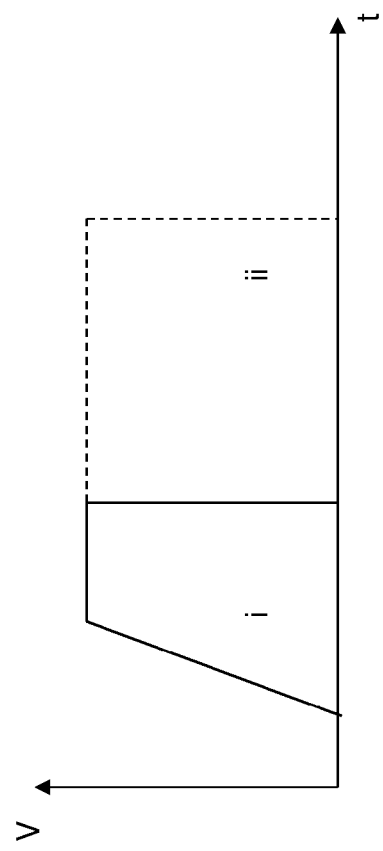

FIGS. 10a and 10b are diagrams of a set of bonding conditions which may be applied in a substrate bonding chamber to determine the order and quality of the bonds formed. The bonding conditions may be applied to any of substrate pair assemblies 100-600, described previously. Shown in FIG. 10a is a temperature profile of a heating source that may be applied to the substrate pair assembly. The temperature profile may include a lower temperature period i followed by a higher temperature period ii, and these temperatures are plotted as a function of time in FIG. 10a. Simultaneously to the temperature profile shown in FIG. 10a, a voltage profile may be applied to substrate pair assemblies 100-600, as a function of time as shown in FIG. 10b. For example, if the first bond to be formed is an anodic bond, which proceeds at a certain temperature and voltage, these conditions may be applied in step i If a higher temperature is required for the second bond, but no voltage, these conditions may be applied in step ii. Accordingly, either the anodic bond I or the second bond II may proceed first, according to the conditions chosen for each step.

Figure 11A:
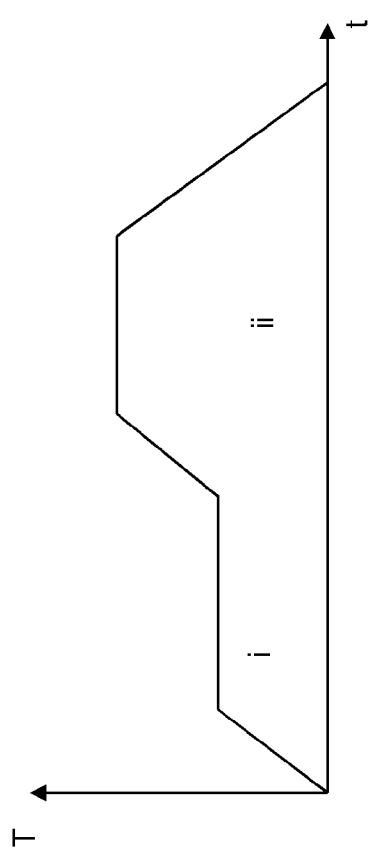
FIGS. 11a and 11b are simplified profiles of a second set of exemplary bonding conditions, wherein one bond is formed under one set of conditions and the other bond is formed under the second set of conditions.
Figure 11B:
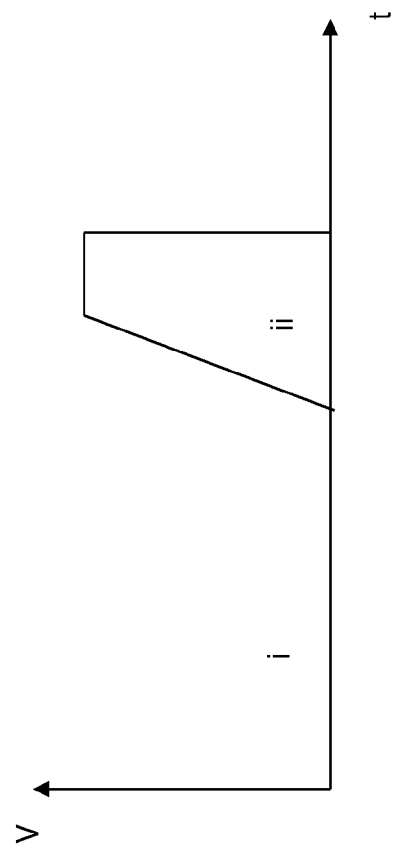

For example, if instead the anodic bond I is to be achieved after the second bonding II, the temperature and voltage profiles shown in FIGS. 11a and 11b may be applied. In FIG. 11a, a ramped temperature function is shown, wherein a first temperature is applied during a first step i and a second temperature is applied during a second step ii. However, in this embodiment, the higher voltage is not applied until the second step ii, during which the anodic bond may be formed.

Figure 12A:
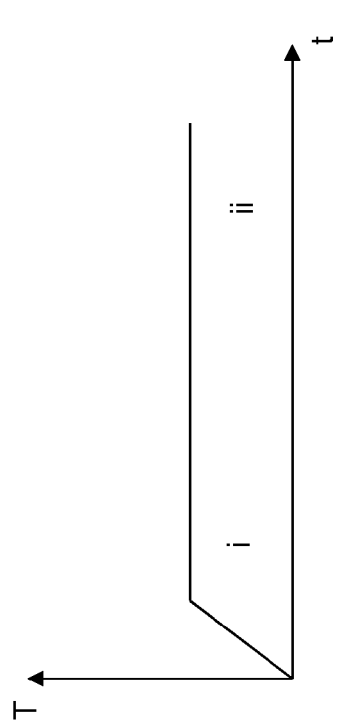
FIGS. 12a and 12b are simplified profiles of a third set of exemplary bonding conditions, wherein one bond is formed under one set of conditions and the other bond is formed under the second set of conditions.
Figure 12B:
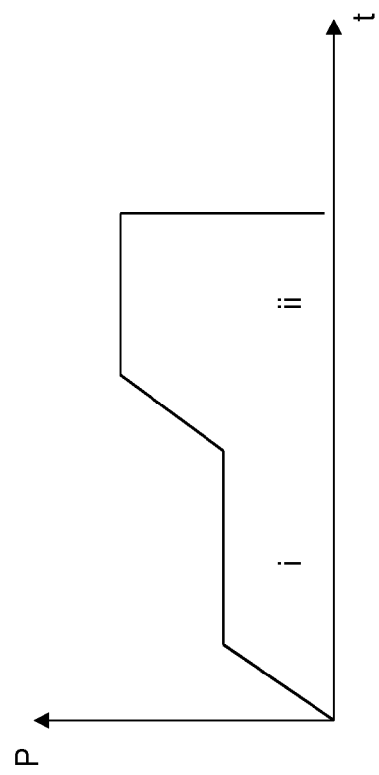

Lastly, FIGS. 12a and 12b show another embodiment of another set of bonding conditions. In FIG. 12a, the temperature profile shown is constant as a function of time. The order of the bonding in this example may be determined by the pressure applied between the substrates as shown in 12b. For a bonding technology requiring higher pressures but constant temperatures, this bond is not achieved until the second step ii.

It should be understood that the bonding parameters of temperature, voltage and pressure may be mixed and matched according to the bonding technologies being used. More generally, as illustrated in FIGS. 10a, 10b, 11a, 11b, 12a and 12b, a first combination bonding conditions may be applied in a first step i, and a second set of bonding conditions may be applied in a second step ii. The bonding conditions may applying at least one of heat, voltage and pressure to the substrate pair assemble to form the first anodic bond and the second bond. The heat, voltage and pressure may be applied in at least two steps i and ii. Either the first step i or the second step ii may achieve the anodic bond I. The second bond II may be achieved in the other step.

Of course, it should be clear that the methods illustrated in FIGS. 10-12 may include additional steps, and may depend on the details of the application. In particular, a third step iii or ramp may be included in addition to the two shown, in order to activate or initiate bonding technology III.

It should also be clear that any of the concepts described above may be mixed or matched with any or all of the other concepts in terms of placement and dimensioning of the bonding features, and control of bonding chamber parameters.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiments described above relate to a bonded optically transparent substrate, it should be understood that the techniques and designs described above may be applied to any of a number of other materials, including optically opaque materials, or optically transparent material which are coated with an opaque film. The methods may also be applied to dielectric substrates in general, as long as these substrates have the requisite amount of conductivity as discussed above. Accordingly, the exemplary implementations set forth above, are intended to be illustrative, not limiting.

What is claimed is:

1. A substrate pair assembly, comprising: a first anodic bond and a second bond which together adhere a silicon wafer to an optically transparent substrate wafer, wherein the second bond is disposed laterally adjacent to the first anodic bond, and wherein the first anodic bond further includes: a raised feature on at least one of the silicon substrate and the optically transparent substrate wherein the raised feature is raised relative to another adjacent surface; a metal oxide, wherein the metal oxide is the covalently bonded oxidation product of a metal material and the optically transparent substrate, and is disposed between the raised feature and at least one of the silicon substrate and the optically transparent substrate.

2. The substrate pair assembly of claim 1, wherein the metal oxide is up to about 10 nm thick, and the metal material is at least about 50 nm thick.

3. The substrate pair assembly of claim 1, wherein the optically transparent substrate comprises ion-rich glass having a resistivity of less than about 8 ohm-cm.

4. The substrate pair assembly of claim 1, wherein the metal material comprises at least one of titanium (Ti), chrome (Cr), silicon (Si), cobalt (Co), aluminum (Al) and zirconium (Zr).

5. The substrate pair assembly of claim 1, further comprising: a microfabricated device, wherein the raised feature defines a perimeter of a hermetically sealed device cavity formed between the silicon substrate and the optically transparent substrate, with the microfabricated device disposed within the hermetically sealed device cavity.

6. The substrate pair assembly of claim 1, wherein the raised feature comprises at least one of material from the optically transparent substrate, material from the semiconductor substrate, and a metal layer deposited on at least one of the optically transparent substrate, the semiconductor substrate.

7. The substrate pair assembly of claim 1, wherein the first anodic bond provides an attribute selected from the group of hermeticity, electrical conductivity, low RF loss, high adhesive strength, leak resistance, thermal conductivity, and the second bond provides a second, different attribute chosen from the same group.

8. The substrate pair assembly of claim 1, wherein the second bond is laterally separated from the first anodic bond by a distance of about 100 microns or more.

9. The substrate pair assembly of claim 1, wherein the second bond comprises one of a polymer, a thermocompression, a solder, a metal alloy and a eutectic bond.

10. The substrate pair assembly of claim 1, wherein the second bond comprises a thermocompression bond using at least one of gold (Au), silver (Ag), or platinum (Pt), and indium (In).

11. The substrate pair assembly of claim 1, wherein the second bond comprises a multilayer stack, with each layer having thicknesses between about 1 and about 10 microns.

12. The substrate pair assembly of claim 11, wherein the multilayer stack includes at least one pair of silicon/gold, silicon\molybdenum, and silicon\silver layers.

13. The substrate pair assembly of claim 11, wherein the multilayer stack is a low temperature solder bond, and includes at least one of indium\gold, indium\silver, gold-tin/gold-copper-silver, indium\copper, antimony-lead/gold-copper-silver alloys.

14. The substrate pair assembly of claim 1, further comprising a third bond, wherein the third bond is laterally separated from the second bond by a distance of about 100 microns or more.

15. The substrate pair assembly of claim 14, wherein the third bond is at least one of a polymer, thermocompression, metal alloy, eutectic, a solder, a metal alloy and a eutectic bond.

16. The substrate pair assembly of claim 14, wherein the third bond comprises a multilayer stack.

17. The substrate pair assembly of claim 16, wherein the multilayer stack includes at least one pair of silicon/gold, silicon\molybdenum, and silicon\silver layers.

18. The substrate pair assembly of claim 16, wherein the multilayer stack is a low temperature solder bond, and includes at least one of indium\gold, indium\silver, gold-tin/gold-copper-silver, indium\copper, antimony-lead/gold-copper-silver alloys.

19. A substrate pair assembly, comprising: a first anodic bond and a second bond which together join a silicon wafer to an optically transparent substrate wafer, wherein the second bond is disposed laterally adjacent to the first anodic bond, and wherein the first anodic bond further includes: a raised feature on at least one of the silicon substrate and the optically transparent substrate wherein the raised feature is raised relative to another adjacent surface; a metal oxide, wherein the metal oxide is the covalently bonded oxidation product of a metal material and the optically transparent substrate, and is disposed between the raised feature and at least one of the silicon substrate and the optically transparent substrate, wherein the microfabricated device comprises at least one of an emitter, detector, an attenuator and reflector of electromagnetic radiation.

20. The substrate pair assembly of claim 19, wherein the device absorbs, reflects, transmits, focuses, emits or attenuates radiation which passes through at least the optically transparent substrate.

21. A method for forming a substrate pair assembly, comprising: providing a silicon substrate and an optically transparent substrate; forming a raised feature on at least one of the silicon substrate and the optically transparent substrate; forming a first layer of a metal oxide material between the raised feature and at least one of the silicon substrate and the optically transparent substrate, wherein the metal oxide is the covalently bonded oxidation product of a metal material and the optically transparent substrate to form a first anodic bond; and forming a second bond which together with the first anodic bond joins the silicon wafer to the optically transparent wafer, wherein the second bond is disposed laterally adjacent to the first anodic bond.

22. The method of claim 21, further comprising: applying at least one of heat, voltage and pressure to the substrate pair assemble to form the first anodic bond and the second bond.

23. The method of claim 22, wherein the at least one of heat, voltage and pressure is applied in at least two steps.

\* \* \* \* \*